(12) United States Patent
Eguchi

(10) Patent No.: US 11,575,368 B2
(45) Date of Patent: Feb. 7, 2023

(54) COMMUNICATION SYSTEM INCLUDING A RECEPTION COUPLER COUPLED TO A TRANSMISSION LINE

(71) Applicant: CANON KABUSHIKI KAISHA, Tokyo (JP)

(72) Inventor: Tadashi Eguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/351,852

(22) Filed: Jun. 18, 2021

(65) Prior Publication Data

US 2021/0409013 A1   Dec. 30, 2021

(30) Foreign Application Priority Data

Jun. 24, 2020   (JP) .............. JP2020-108794

(51) Int. Cl.
   *H01P 3/02*        (2006.01)
   *H03K 5/1252*   (2006.01)
   *H01P 3/08*        (2006.01)

(52) U.S. Cl.
   CPC ........... *H03K 5/1252* (2013.01); *H01P 3/026* (2013.01); *H01P 3/08* (2013.01)

(58) Field of Classification Search
   CPC ......... H03K 5/1252; H01P 3/08; H01P 3/026; H01P 1/061; H01P 3/02; H01P 3/084; H01P 3/081
   See application file for complete search history.

(56) References Cited

U.S. PATENT DOCUMENTS 5,530,424 A       6/1996  Harrison et al.
2017/0373368 A1*  12/2017  Srirattana ............ H04B 1/0064

* cited by examiner

*Primary Examiner* — Jung Kim
(74) *Attorney, Agent, or Firm* — Canon U.S.A., Inc. IP Division

(57) ABSTRACT

A communication system includes a transmission line and a reception coupler that couples to the transmission line in an electromagnetic field and moves along the transmission line, wherein the reception coupler has end parts narrower than other parts with respect to a transmission direction of the transmission line.

11 Claims, 17 Drawing Sheets

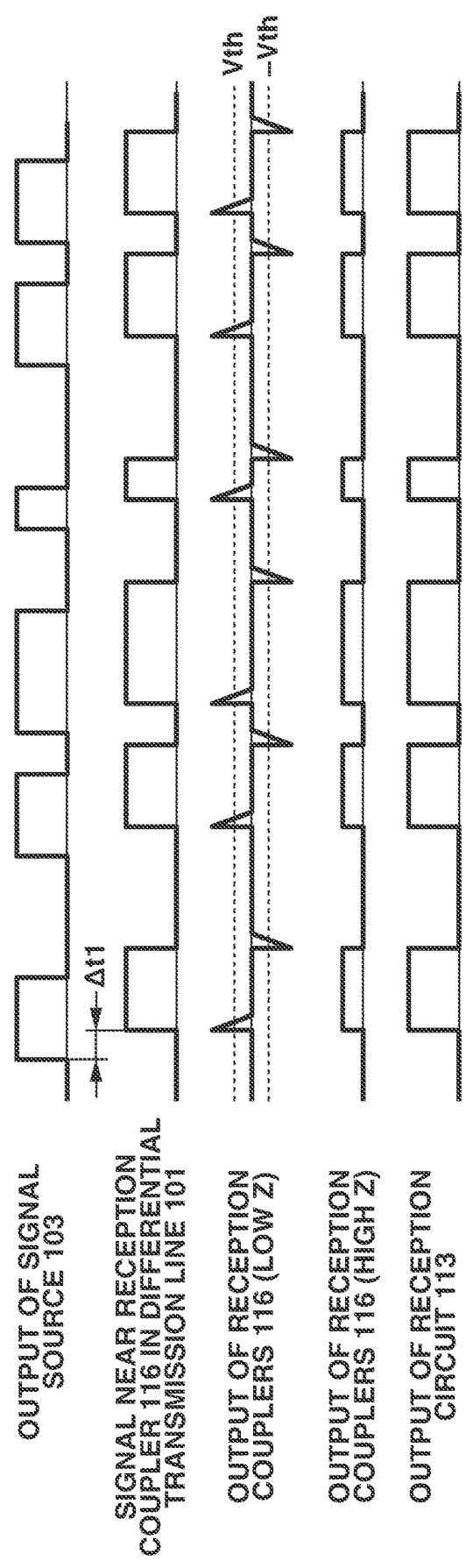

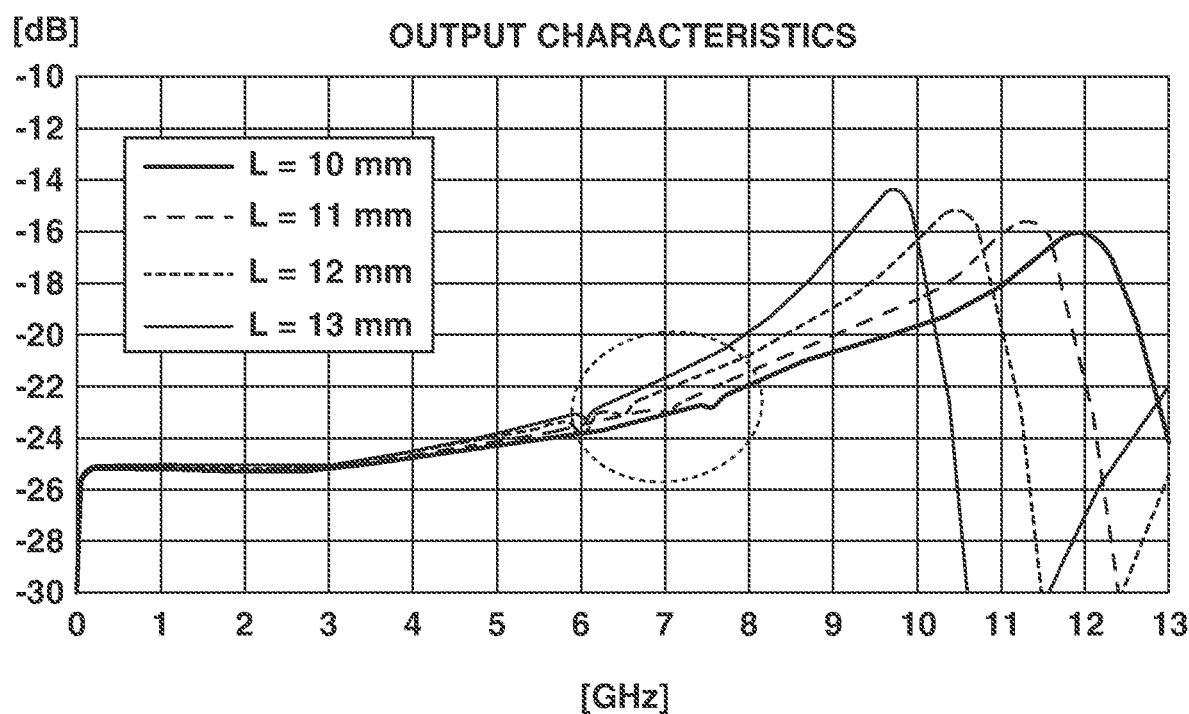
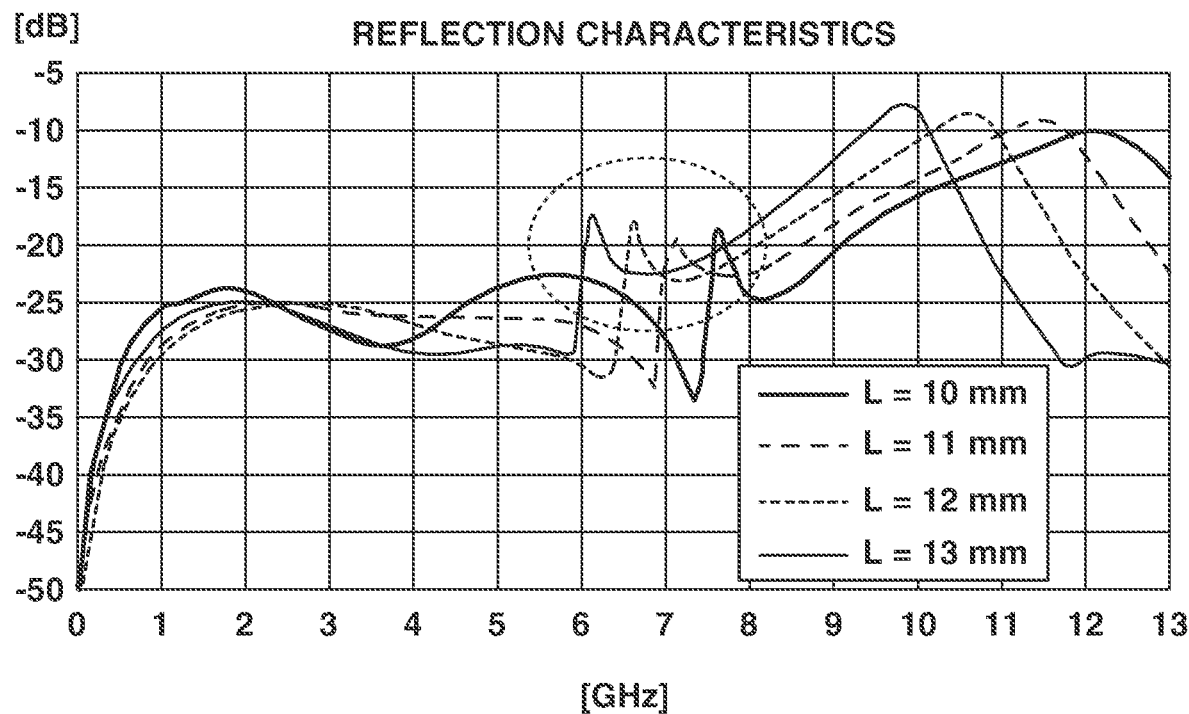

FIG.6

| | RHOMBIC RECEPTION COUPLERS 111 | | RECTANGULAR RECEPTION COUPLERS 116 | |
|---|---|---|---|---|
| | 1 GHz GAIN [dB] | FREQUENCY OF GAIN LOWER BY 3 dB THAN 1 GHz [MHz] | 1 GHz GAIN [dB] | FREQUENCY OF GAIN LOWER BY 3 dB THAN 1 GHz [MHz] |
| L = 10 mm | -25.18 | 20 | -24.45 | 23 |
| L = 11 mm | -25.09 | 19 | -24.44 | 21 |
| L = 12 mm | -25.04 | 18 | -23.32 | 27 |
| L = 13 mm | -25.03 | 17 | -23.37 | 24 |

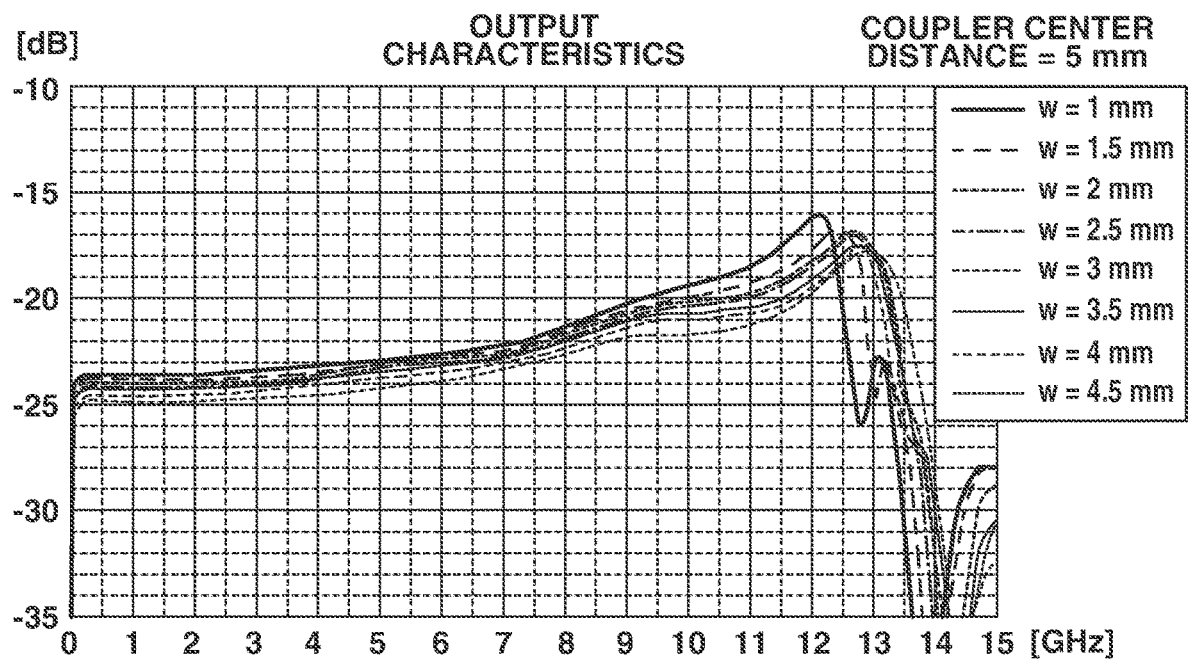
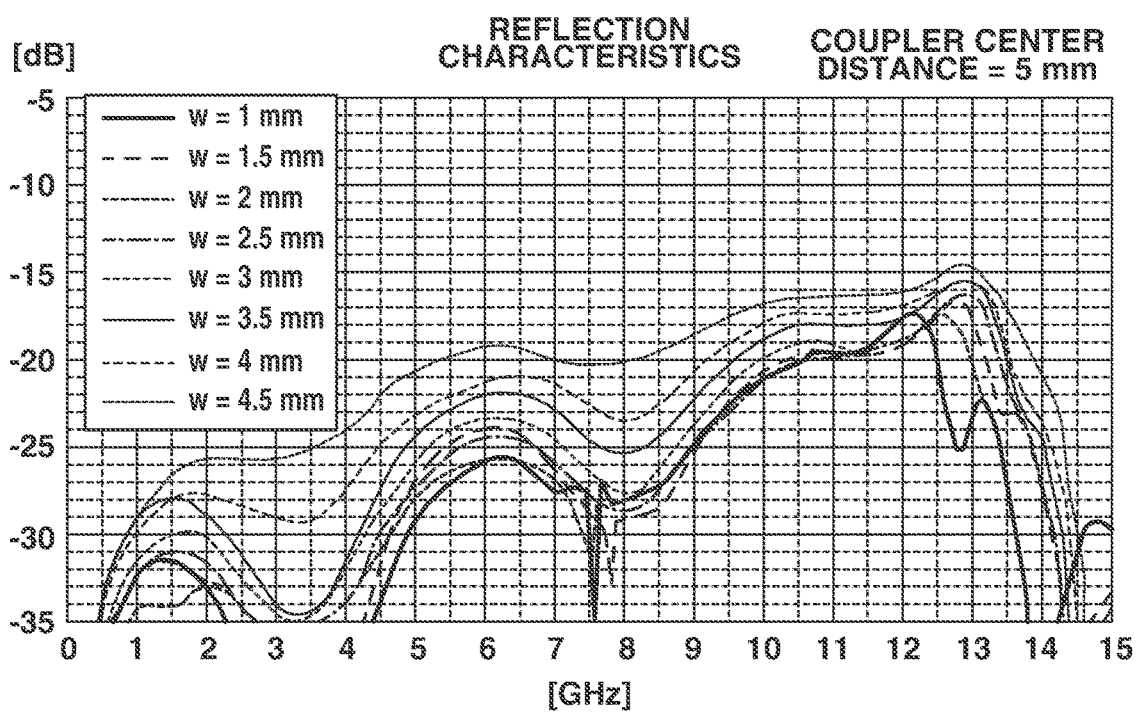

COMMUNICATION SYSTEM INCLUDING A RECEPTION COUPLER COUPLED TO A TRANSMISSION LINE

BACKGROUND

Field

The present disclosure relates to a communication system.

Description of the Related Art

In recent years, there have been more and more systems in which a device communicating large amounts of data, such as a camera, is installed in a production system or a robotic device to transfer data at high speed between a mechanical moving section and a fixed section. U.S. Pat. No. 5,530,424 discusses a transmission apparatus that transmits camera data captured by an X-ray camera in a computed tomography (CT) apparatus from a rotary moving unit to a fixed unit. At least either the fixed section or the moving section has a transmission line extended in a movement direction. Data transmission is carried out between the transmission line and a coupler coupled to the transmission line through a magnetic field, an electric field, or both. In order to strengthen the coupling between the transmission line and the coupler and increase the magnitude of signals, it is necessary to shorten the distance between the transmission line and the coupler.

However, when the coupler moves near the transmission line, the impedance of the transmission line may become disturbed under influence of the coupler. If the impedance is greatly disturbed, the input characteristics of the transmission line can become degraded and the waveform of an input signal can become distorted. An output signal of the coupler has lower gain with a frequency bandwidth where the reflection of a signal is large.

SUMMARY

Various embodiments of the present disclosure suppress the disturbance of signals in wireless communication that could be caused by electromagnetic coupling between a coupler moving along a transmission line and the transmission line.

According to various embodiments, a communication system includes a transmission line and a reception coupler that couples to the transmission line in an electromagnetic field and moves along the transmission line, wherein the reception coupler has end parts narrower than other parts with respect to a transmission direction of the transmission line.

Further features of various embodiments of the present disclosure will become apparent from the following description of exemplary embodiments with reference to the attached drawings.

BRIEF DESCRIPTION OF THE DRAWINGS

FIG. 2 is a timing chart of signals in the communication system.

FIGS. 5A and 5B are diagrams respectively illustrating frequency characteristics of output and reflection according to the first exemplary embodiment.

FIG. 6 is a diagram illustrating numeric values of simulation results according to the first exemplary embodiment.

FIGS. 14A and 14B are respectively illustrating frequency characteristics of output and reflection according to the third exemplary embodiment.

DESCRIPTION OF THE EMBODIMENTS

Figure 1A:
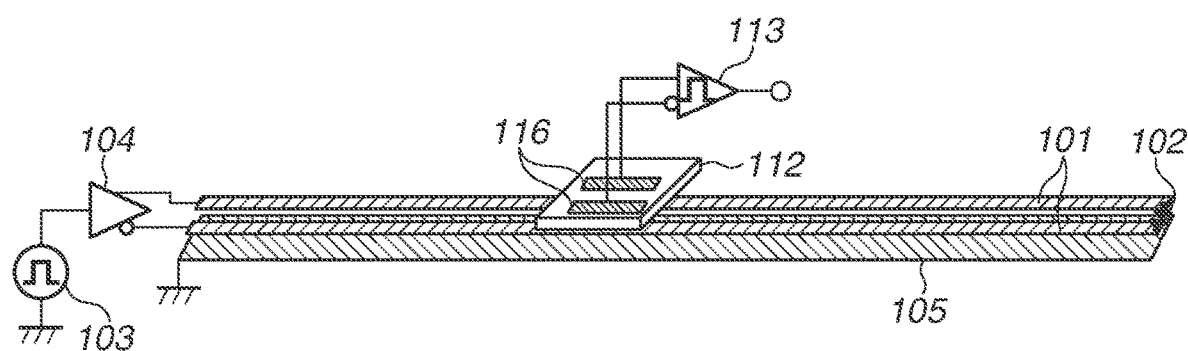
FIGS. 1A and 1B are diagrams illustrating a configuration example of a communication system.
Figure 1B:
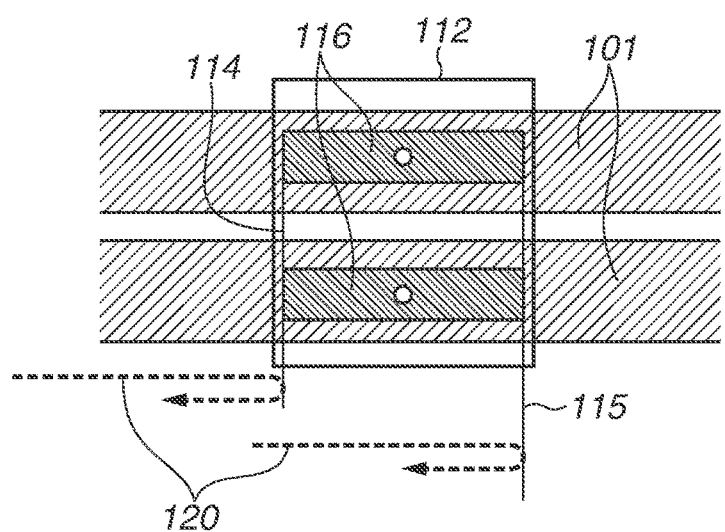

Exemplary embodiments will be described in detail below with reference to the accompanying drawings. It should be understood that the following exemplary embodiments are illustrative examples for implementing various embodiments of the present disclosure, and may be corrected and modified as appropriate depending on the configuration of an apparatus according to the various embodiments of the present disclosure and other various conditions. The present invention is not limited to the following exemplary embodiments. Not all of the combinations of the features described in the present exemplary embodiments are used to the solution for the present invention. FIGS. 1A and 1B are diagrams illustrating a communication system. FIG. 2 is a timing chart of signals in the communication system illustrated in FIGS. 1A and 1B. Differential transmission lines 101 are transmission lines. A signal source 103 outputs data to a differential transmission buffer 104. The differential transmission buffer 104 receives the input of the data and outputs differential signals to one ends of the differential transmission lines 101. The other ends of the differential transmission lines 101 are terminated at a termination resistor 102 that is approximately equal to the characteristic impedance of the differential transmission lines 101. A ground surface 105 is a ground surface that provides the reference potential of the differential transmission lines 101 and is formed on the side of a substrate (not illustrated) opposite to the side on which the differential transmission lines 101 are formed. Reception couplers 116 move along the differential transmission lines 101. The reception couplers 116 couple to the differential transmission lines 101 through an electromagnetic field and detect the differential signals transmitted on the differential transmission lines 101. The electromagnetic-field coupling in the present exemplary embodiment includes coupling through an electric field, coupling through a magnetic field, and coupling through both an electric field and a magnetic field. A reception circuit 113 shapes the waveforms of the differential signals detected by the reception couplers 116 and outputs reception signals.

As illustrated in FIG. 2, signals in the differential transmission lines 101 near the reception couplers 116 are delayed by time $\Delta t1$ with respect to an output signal of the signal source 103. As illustrated in FIG. 2, if the input impedance of the reception circuit 113 is low, the output signals of the reception couplers 116 are edge signals. The reception circuit 113 is a waveform shaping circuit such as a comparator with a hysteresis voltage of $\pm Vth$, which shapes the waveforms of the output signals of the reception couplers 116. If the output signals of the reception couplers 116 are larger than +Vth, the reception circuit 113 maintains a high level until the output signals of the reception couplers 116 become smaller than −Vth. If the output signals of the reception couplers 116 are smaller than −Vth, the reception circuit 113 maintains a low level until the output signals of the reception couplers 116 become larger than +Vth. As illustrated in FIG. 2, the output signals of the reception circuit 113 are obtained by shaping the waveforms of the output signals of the reception couplers 116 and demodulating the output signals.

On the other hand, as illustrated in FIG. 2, if the input impedance of the reception circuit 113 is high, the output signals of the reception couplers 116 are similar in waveform to the signals in the differential transmission lines 101 near the reception couplers 116, and have small amplitude. Thus, the reception circuit 113 only needs to be an amplifier that amplifies a signal up to a size that allows digital signal processing.

When the reception couplers 116 move over the differential transmission lines 101, the impedance of the differential transmission lines 101 becomes disturbed under the influence of the reception couplers 116. As the reception couplers 116 are closer to the differential transmission lines 101, the impedance of the differential transmission lines 101 is more greatly disturbed. If the impedance of the differential transmission lines 101 is greatly disturbed, the input characteristics of the differential transmission lines 101 become degraded. Accordingly, if an attempt is made to input normal signals from the differential transmission buffer 104, the frequency component with large reflection is unlikely to be input so that the waveforms of the input signals are distortion.

Referring to FIG. 1B, the principle of how the signals transmitted from the reception couplers 116 to the differential transmission lines 101 are disturbed by the reception couplers 116 will be described. The pair of reception couplers 116 has a rectangular shape. Signals are input from the differential transmission buffer 104 to the signal input terminals of the differential transmission lines 101. The parts of the differential transmission lines 101 without the reception couplers 116 have free space above the differential transmission lines 101. At end portions 114 of the reception couplers 116, the parts above the differential transmission lines 101 are blocked by electrodes of the reception couplers 116 or dielectrics for supporting the electrodes. This leads to a change in the transmission mode to cause reflection. At end portions 115 of the reception couplers 116, the parts above the differential transmission lines 101 change from the blocked state to free space, which also leads to a change in the transmission mode to cause reflection. Reflected waves 120 are reflected waves of the signals having been transmitted through the differential transmission lines 101.

In this way, large reflection, if any, affects the input characteristics of the differential transmission lines 101. As for the output characteristics of the reception couplers 116, too, lower gain is obtained with a frequency bandwidth where reflection is large due to the affected input characteristics so that correct signals cannot be received, which causes a reception error. Hereinafter, an exemplary embodiment that allows suppression of the reflection will be described.

Figure 3A:
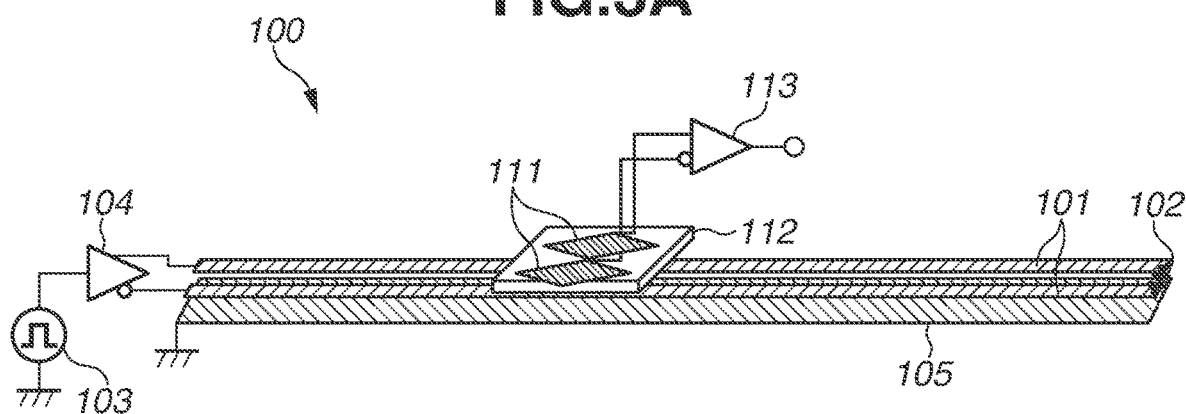
FIGS. 3A and 3B are diagrams illustrating a configuration example of a communication system according to a first exemplary embodiment.

FIG. 3A is a diagram illustrating a configuration example of a communication system 100 according to a first exemplary embodiment. In the example illustrated in FIG. 3A, a pair of reception couplers 111 is provided instead of the pair of reception couplers 116 illustrated in FIG. 1A. The reception couplers 111 are different in shape from the reception couplers 116. The communication system 100 has a pair of differential transmission lines 101, a termination resistor 102, a signal source 103, a differential transmission buffer 104, a ground surface 105, the pair of reception couplers 111, a substrate 112, and a reception circuit 113.

The signal source 103 outputs data to the differential transmission buffer 104. The differential transmission buffer 104 receives the input of the data and outputs differential signals to one ends of the differential transmission lines 101. The other ends of the differential transmission lines 101 are terminated at the termination resistor 102 that is approximately equal to a characteristic impedance of the differential transmission lines 101. The ground surface 105 is a ground surface that provides the reference potential of the differential transmission lines 101 and is formed on the side of a substrate (not illustrated) opposite to the side on which the differential transmission lines 101 are formed. The pair of differential transmission lines 101 transmits the differential signals. The pair of reception couplers 116 moves along the differential transmission lines 101. The reception couplers 116 are coupled to the differential transmission lines 101 through an electric field, a magnetic field, or both and detect the differential signals transmitted on the differential transmission lines 101. The reception circuit 113 shapes the waveforms of the differential signals detected by the reception couplers 116 and outputs a reception signal.

Signals in the communication system 100 are similar to the signals illustrated in FIG. 2. If the output signals of the reception couplers 111 become larger than +Vth, the reception circuit 113 maintains a high level until the output signal of the reception couplers 116 becomes smaller than −Vth. If the output signal of the reception couplers 111 becomes smaller than −Vth, the reception circuit 113 maintains a low level until the output signal of the reception couplers 116 becomes larger than +Vth.

The transmission lines are differential microstrip lines that are formed by the differential transmission lines 101 formed on the upper surface of the substrate (not illustrated) and the ground surface 105 formed on the lower surface of the substrate (not illustrated). The pair of reception couplers 111 is differential reception couplers that are formed on the substrate 112 and move in space above the pair of differential transmission lines 101 along the pair of differential transmission lines 101 while keeping a constant distance from the pair of differential transmission lines 101. The substrate 112 supports the pair of reception couplers 111.

The termination resistor 102 is a termination resistor of the differential transmission lines 101 that terminates the differential signals input from the differential transmission buffer 104 to the differential transmission lines 101. The signal source 103 is an input signal source of the differential transmission buffer 104. The reception circuit 113 is connected to the reception couplers 111, shapes the waveforms of the output signals of the reception couplers 111, and then outputs the signals as reception signals.

Figure 3B:
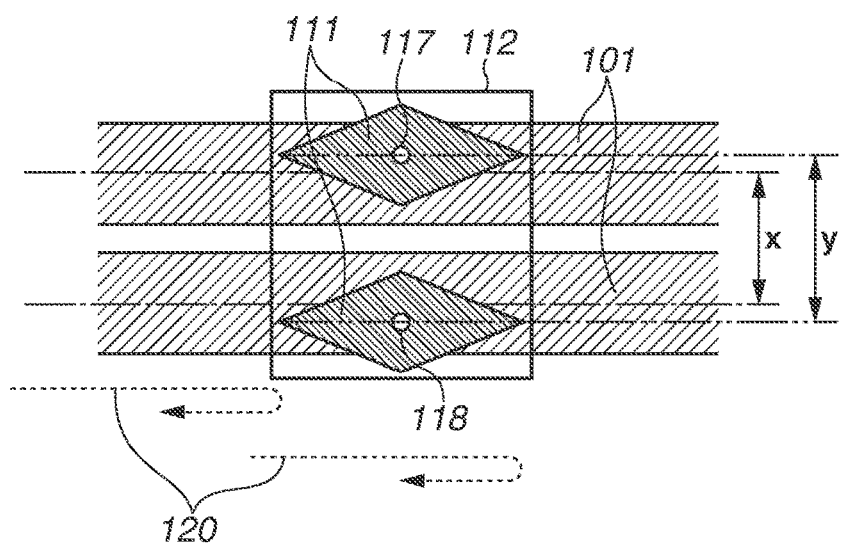

FIG. 3B is an enlarged view of the reception couplers 111 illustrated in FIG. 3A. The pair of reception couplers 111 has a rhombic shape, which is narrower at the end portions on the signal input side and signal termination side of the differential transmission lines 101 than at central parts around connection points 117 and 118 to the reception circuit 113. The reception couplers 111 become gradually wider from the ends on the signal input side and signal termination side of the differential transmission lines 101 toward the connection points 117 and 118. A center distance y between the pair of reception couplers 111 is longer than a center distance x between the pair of differential transmission lines 101. Reflected waves 121 are reflected waves of signals having been transmitted through the differential transmission lines 101, which are smaller than the reflected waves 120 illustrated in FIG. 1B.

Figure 4A:
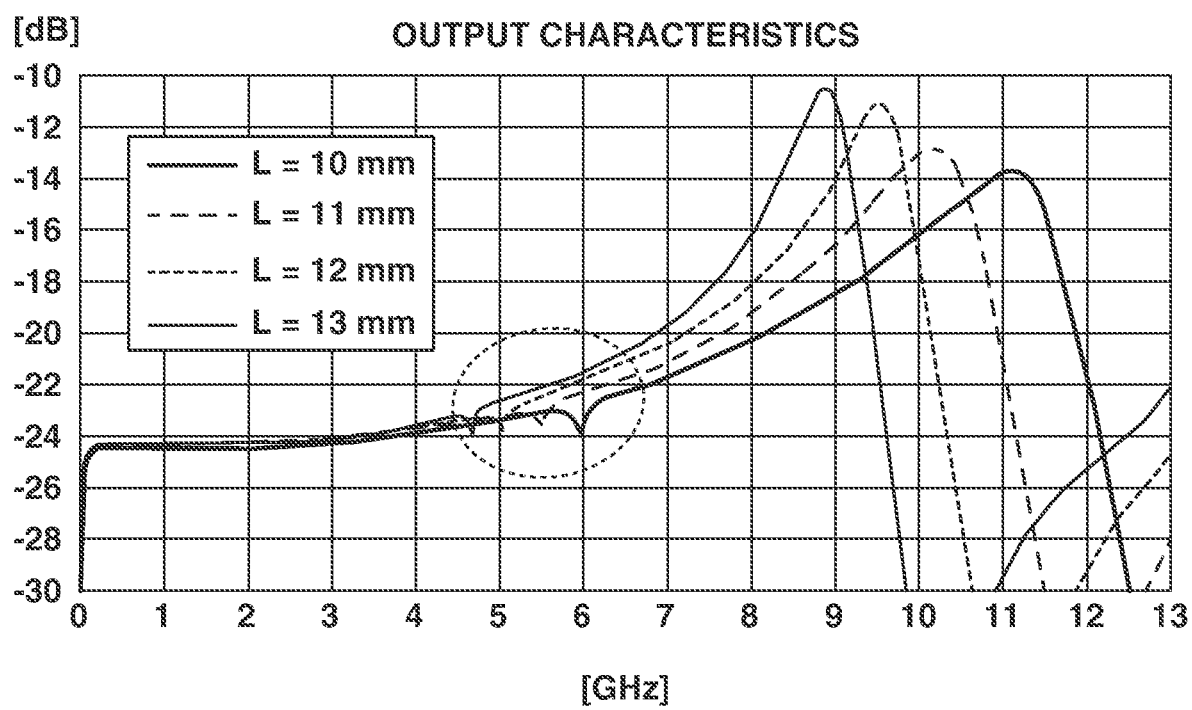
FIGS. 4A and 4B are diagrams respectively illustrating frequency characteristics of output and reflection according to the first exemplary embodiment.
Figure 4B:
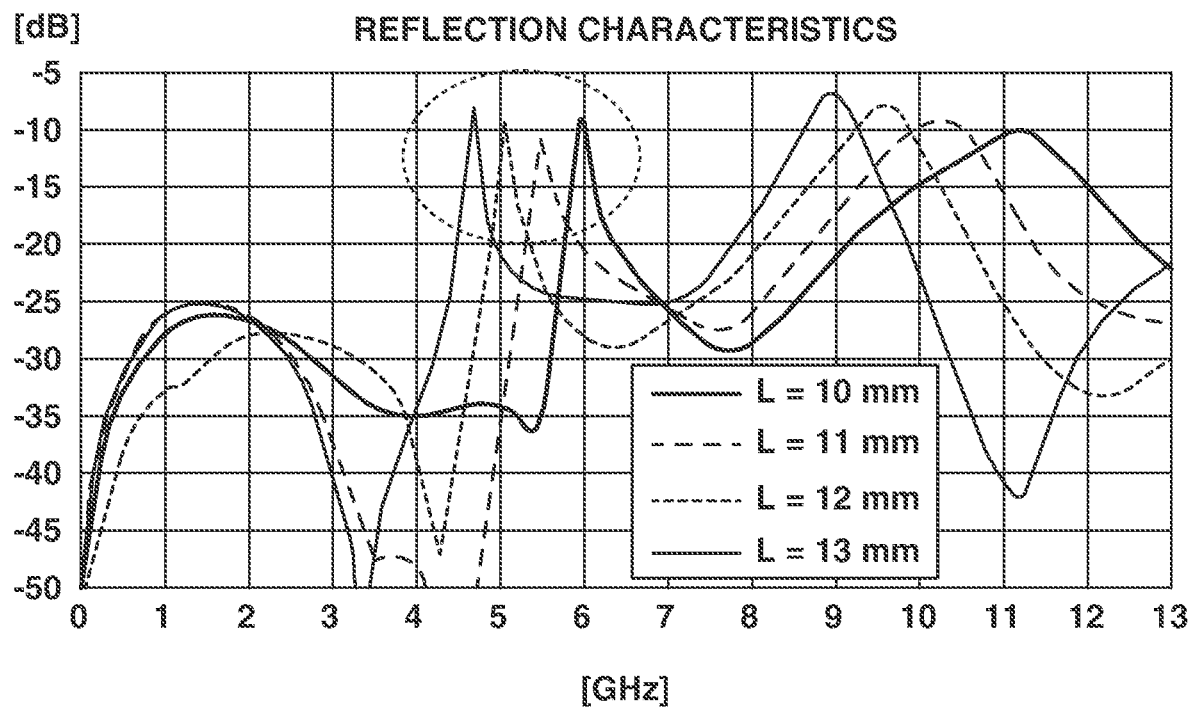

FIGS. 4A and 4B are diagrams illustrating simulation results of the communication system including the reception couplers 116 illustrated in FIGS. 1A and 1B. The reception couplers 116 are rectangular in shape.

FIG. 4A is a diagram illustrating simulation results of frequency characteristics of signals that are input from the input terminals of the differential transmission lines 101 and output from the reception couplers 116 in the communication system illustrated in FIGS. 1A and 1B. The differential transmission lines 101 are differential microstrip lines with a differential impedance of 100Ω that are formed on a substrate with a thickness of 3.2 mm and a relative permittivity of 2.2. The pair of reception couplers 116 is rectangular couplers of which width and center distance are determined to obtain as large signals as possible in the differential transmission lines 101. The differential impedance of the reception couplers 116 is set to 10 kΩ.

FIG. 4B is a diagram illustrating simulation results of input reflection characteristics of the differential transmission lines 101 in the communication system illustrated in FIGS. 1A and 1B in a case where the simulation has been performed under the same conditions as the conditions illustrated in FIG. 4A. As illustrated in FIGS. 4A and 4B, the simulation is performed with varying lengths L of the reception couplers 116 along the transmission direction of the differential transmission lines 101. In the frequency characteristics illustrated in FIG. 4A, the frequency with the highest gain (hereinafter called a resonance point) changes in accordance with the length L of the reception couplers 116, and a drop of gain of about 0.7 dB to 1 dB occurs at a frequency about half the resonance point in a part enclosed by a dotted-line circle. In this way, at the frequency with a sharp gain change, the phase also becomes disturbed, and if signals with the bandwidth are transmitted, the signals will become deteriorated. As compared to FIG. 4B, the frequencies at the drops of gain (in the part enclosed by a dotted-line circle) illustrated in FIG. 4A match peak frequency bandwidths of the input reflection characteristics except for the resonance points (in a part enclosed by a dotted-line circle) illustrated in FIG. 4B. Accordingly, it can be seen that reflection has occurred at some frequencies of the signals to be input to the differential transmission lines 101, and the frequency components to be transmitted have become small.

FIGS. 5A and 5B are diagrams illustrating simulation results of the communication system 100 including the reception couplers 111 illustrated in FIGS. 3A and 3B. The reception couplers 111 is rhombic in shape.

FIG. 5A is a diagram illustrating simulation results of frequency characteristics of signals that are input from the input terminals of the differential transmission lines 101 and output from the reception couplers 111 in the communication system 100 illustrated in FIGS. 3A and 3B. The simulation conditions are similar to the conditions in the case of FIG. 4A. The reception couplers 111 are rhombic couplers of which width and center distance are determined so as to obtain as large signals as possible.

FIG. 5B is a diagram illustrating simulation results of input reflection characteristics of the differential transmission lines 101 in the communication system 100 illustrated in FIGS. 3A and 3B in a case where the simulation has been performed under the same conditions as the conditions illustrated in FIG. 5A. As illustrated in FIGS. 5A and 5B, the simulation is performed with varying lengths L of the reception couplers 111 along the transmission direction of the differential transmission lines 101.

As compared to the characteristics illustrated in FIG. 4A, the characteristics illustrated in FIG. 5A have low peak gains and the peaks are shifted toward the high band side. This results in favorable gain flatness and the frequency bands extend toward the high band side.

FIG. 6 is a diagram illustrating numeric values of simulation results with the rhombic reception couplers 111 illustrated in FIG. 5A and the rectangular reception couplers 116 illustrated in FIG. 4A. FIG. 6 illustrates gains [dB] at 1 GHz on the low frequency band side and frequencies of gains 3 dB lower than the gains at 1 GHz. In the case with the rhombic reception couplers 111, as compared to the case with the rectangular reception couplers 116, the frequencies of gains 3 dB lower than the gains at 1 GHz are lower than the gains at 1 GHz with all the lengths L, and the frequency bands extend toward the low band side.

The drops of gain enclosed by a dotted-line circle in FIG. 5A are as small as 0.4 dB or less and are shifted to the high band side, as compared to the drops of gain enclosed by a dotted-line circle in FIG. 4A. In the input reflection characteristics illustrated in FIG. 5B, the peaks of reflection except for the resonance points (in the part enclosed by a dotted-line circle) are small and shifted to the high band side, as compared to the input reflection characteristics illustrated in FIG. 4B. As illustrated in FIG. 5A, the gains are flattened and the bandwidths are widened, thereby reducing distortion in the signals to be transmitted. Moreover, if the drops of gain at specific frequencies become smaller, the distortion in the signals can be further decreased and communication errors can be thereby reduced.

Figure 7A:
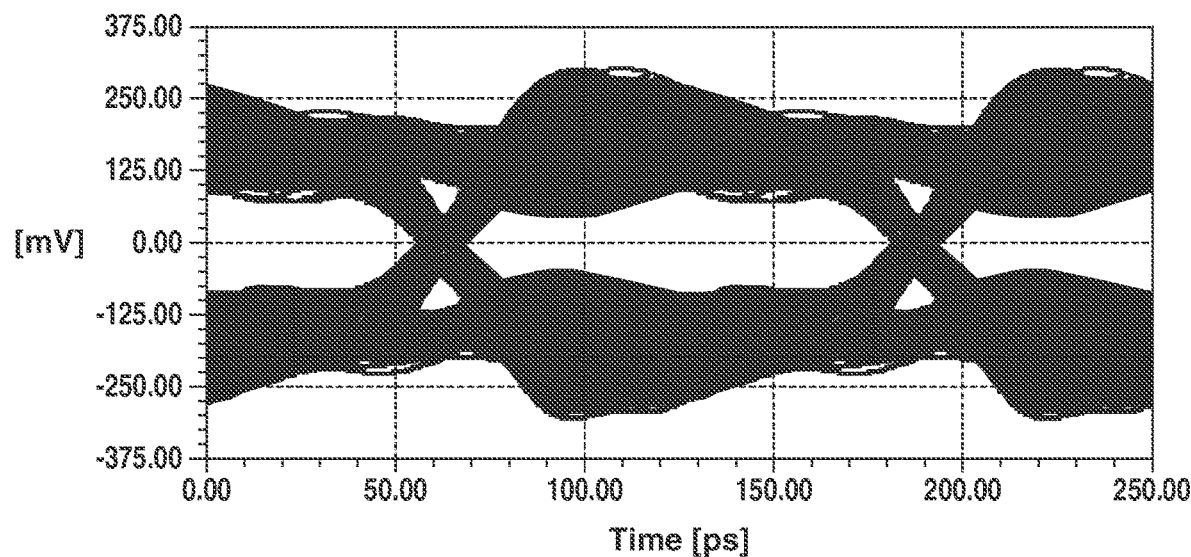
FIGS. 7A and 7B are diagrams illustrating eye patterns of output signals according to the first exemplary embodiment.
Figure 7B:
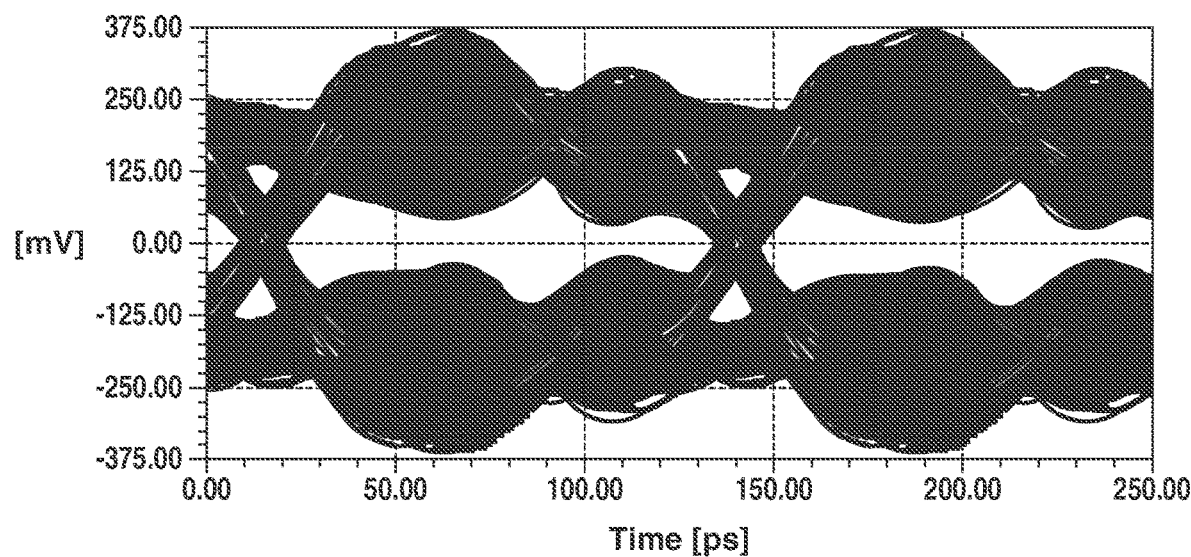

FIG. 7A illustrates an eye pattern of output signals of the rhombic reception couplers 111 with a length L of 12 mm, which is obtained by inputting 8-Gbps random signals with an amplitude of ±600 mV to the differential transmission lines 101 in the communication system 100 illustrated in FIGS. 3A and 3B. FIG. 7B illustrates an eye pattern of output signals of the rectangular reception couplers 116 with a length L of 12 mm, which is obtained by inputting 8-Gbps random signals with an amplitude of ±600 mV to the differential transmission lines 101 in the communication system illustrated in FIGS. 1A and 1B. In the eye pattern with the rhombic reception couplers 111 illustrated in FIG.

7A, the signal waveform have been improved as compared to the eye pattern with the rectangular reception couplers 116 illustrated in FIG. 7B.

The principle of how the reception frequency characteristics with the rhombic reception couplers 111 illustrated in FIGS. 3A and B have been improved will be described. The end surface reflection of the rectangular reception couplers 116 has been described with reference to FIG. 1B. As illustrated in FIG. 3B, the rhombic reception couplers 111 gradually change in width due to the narrow end portions of the reception couplers 111. Thus, when the signals transmitted through the differential transmission lines 101 have reached the end surfaces of the reception couplers 111, the impedance of the differential transmission lines 101 continuously changes without occurrence of large reflection. In addition, when the signals transmitted through the differential transmission lines 101 pass immediately below the centers of the reception couplers 111, the reflection is suppressed at the end portions of the reception couplers 111 due to the width that gradually becomes narrower at the end portions thereof.

The resonance points in a case of the rhombic reception couplers 111 illustrated in FIGS. 5A and 5B are higher than the resonance points in a case of the rectangular reception couplers 116 illustrated in FIGS. 4A and 4B due to the increased resonance components on the short wavelength side, and the frequency characteristics are improved due to the absence of sharp characteristics. In a case where the width of the reception couplers 111 is half or less than the width of the differential transmission lines 101, the areas of the differential transmission lines 101 covered by the portions of the reception couplers 111 with a short length are decreased and thus the influence of reflection caused by the reception couplers 111 is reduced. Thus the above-described effects are unlikely to be obtained.

Figure 8A:
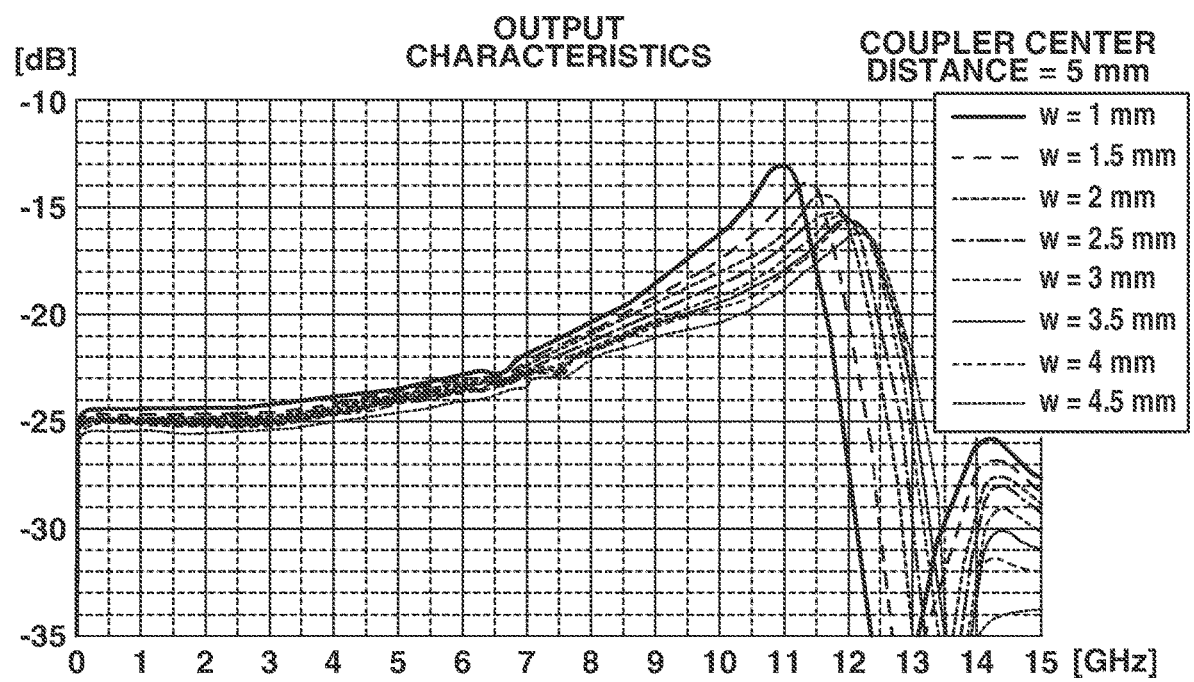
FIGS. 8A and 8B are diagrams respectively illustrating frequency characteristics of output and reflection according to the first exemplary embodiment.
Figure 8B:
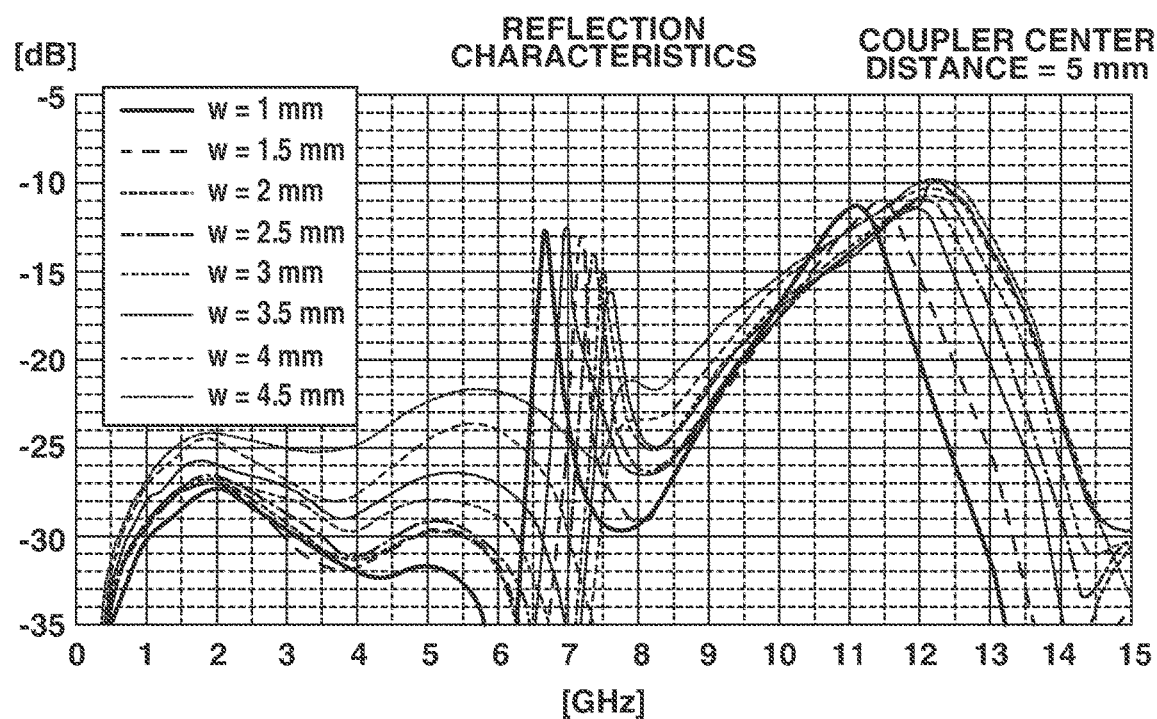

FIG. 8A is a diagram illustrating output characteristics of the rectangular reception couplers 116 illustrated in FIGS. 1A and 1B, where the center distance y between the reception couplers 116 is fixed to 5 mm that obtains the largest gain, and the width w of the reception couplers 116 is changed from 1 to 4.5 mm. FIG. 8B is a diagram illustrating input reflection characteristics of the differential transmission lines 101 with the use of the rectangular reception couplers 116 under the same conditions as the conditions in the case of FIG. 8A. The width of the differential transmission lines 101 is 3.1 mm. Referring to FIG. 8B, as the width w of the reception couplers 116 is larger, the peaks of the reflection characteristics with bandwidths of 6 to 7 GHz bandwidth become smaller and the influence of the reflection on the output characteristics is reduced.

If the width of the reception couplers is 1.5 mm or less that is half or less than the line width of 3.1 mm of the differential transmission lines 101, the output characteristics are hardly different between the rectangular reception couplers 116 and the rhombic reception couplers 111, although there is a difference in the reflection characteristics. In this case, the peak of the gain is large, and the gain flatness is not improved.

FIGS. 5A and 5B, and FIGS. 7A and 7B illustrate the characteristics where the reception couplers have a width of 4 mm. In a case of the rhombic reception couplers 111, as compared to the rectangular reception couplers 116, the resonance points are higher due to the increased resonance components on the short wavelength side, and the frequency characteristics are improved due to the absence of sharp characteristics.

Next, the center distance y between the rhombic reception couplers 111 illustrated in FIG. 3B will be described. The line width of the differential transmission lines 101 and the center distance x between the differential transmission lines 101 are freely selectable. If the width of a single transmission line is set to a width with nearly half the differential impedance, the line width of the differential transmission lines 101 and the center distance x therebetween can be set to very large values. However, increasing the center distance x between the differential transmission lines 101 makes it difficult to reduce common noise. Thus, the width of the differential transmission lines 101 and the center distance x between the differential transmission lines 101 are generally decreased to an extent that the output signals of the reception couplers 111 do not become too small.

Figure 9A:
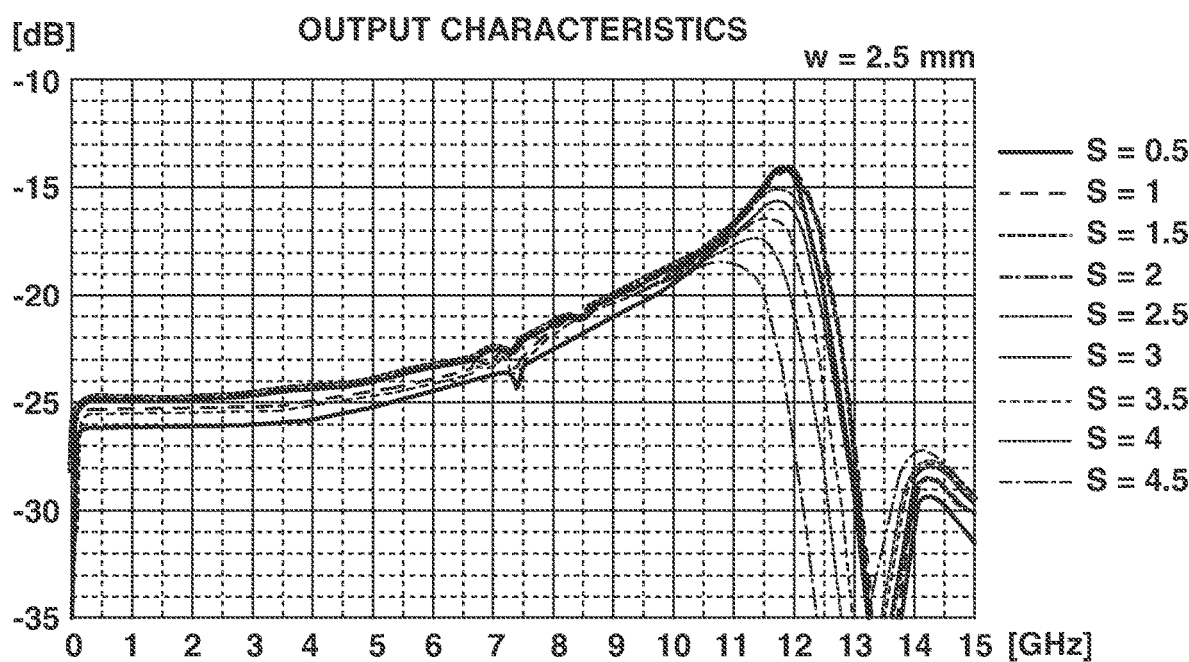
FIGS. 9A and 9B are diagrams respectively illustrating output frequency characteristics and gain at 1 GHz according to the first exemplary embodiment.
Figure 9B:
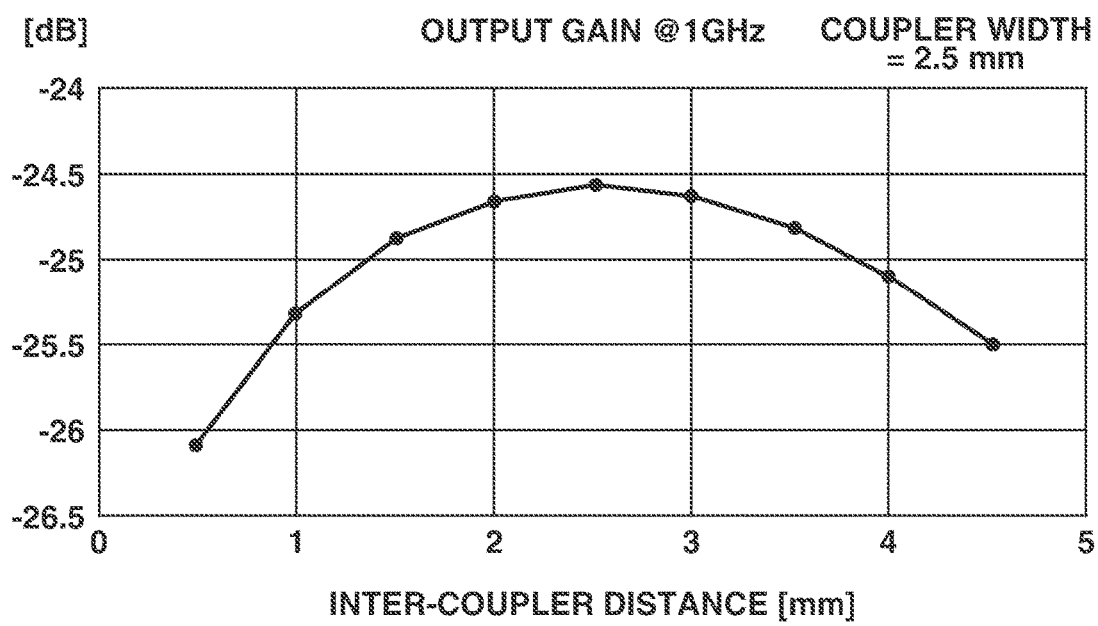

FIGS. 9A and 9B are diagrams illustrating simulation results of output signals of the pair of rhombic reception couplers 111, where the width of the reception couplers 111 is constant and a distance S between the reception couplers 111 is varied. The width w of the reception couplers 111 is 2.5 mm. FIG. 9A illustrates frequency characteristics of output signals of the reception couplers 111 with varying distances S between the reception couplers 111. FIG. 9B illustrates a relationship between the output gain of the reception couplers 111 at 1 GHz and the distance S between the reception couplers 111.

The center distance x between the differential transmission lines 101 is 3.5 mm. In particular, when the input impedance of the reception circuit 113 to receive signals from the reception couplers 111 is high and the distance S between the reception couplers 111 is short, differential signals become small due to the coupling between the reception couplers 111. Thus, the distance S between the reception couplers 111 needs to be increased to an extent that the coupling between the reception couplers 111 does not affect the gain of the output characteristics.

On the other hand, the center distance x between the differential transmission lines 101 and the line width of the differential transmission lines 101 are uniquely determined by the differential impedance. Thus, the signals will become small unless the reception couplers 111 are arranged not to be excessively shifted from the areas of the differential transmission lines 101.

Referring to FIG. 9B, it can be seen that setting the distance S between the reception couplers 111 to 1.5 mm or more reduces the influence of the coupling between the reception couplers 111 and brings about higher gains. On the other hand, it can be seen that setting the distance S between the reception couplers 111 to 3.5 mm or more reduces the coupling between the reception couplers 111 and the differential transmission lines 101 and brings about lower gain.

The center distance y between the reception couplers 111 is the sum of the distance S between the reception couplers 111 and the width w of the reception couplers 111. The width w of the reception couplers 111 is 2.5 mm. The distance S between the reception couplers 111 is appropriately 1.5 mm to 3.5 mm. Thus, the center distance y between the reception couplers 111 is appropriately 4 mm to 6 mm.

In FIGS. 9A and 9B, the width w of the reception couplers 111 is set to 2.5 mm for the sake of describing the center distance y between the reception couplers 111 relative to the center distance x between the differential transmission lines 101. The width w of the reception couplers 111 is preferably further increased to suppress the gain peak and achieve gain flatness while achieving certain gain. The center distance y between the reception couplers 111 is thus further increased so that the center distance y between the reception couplers 111 becomes longer than the center distance x between the differential transmission lines 101.

Figure 10A:
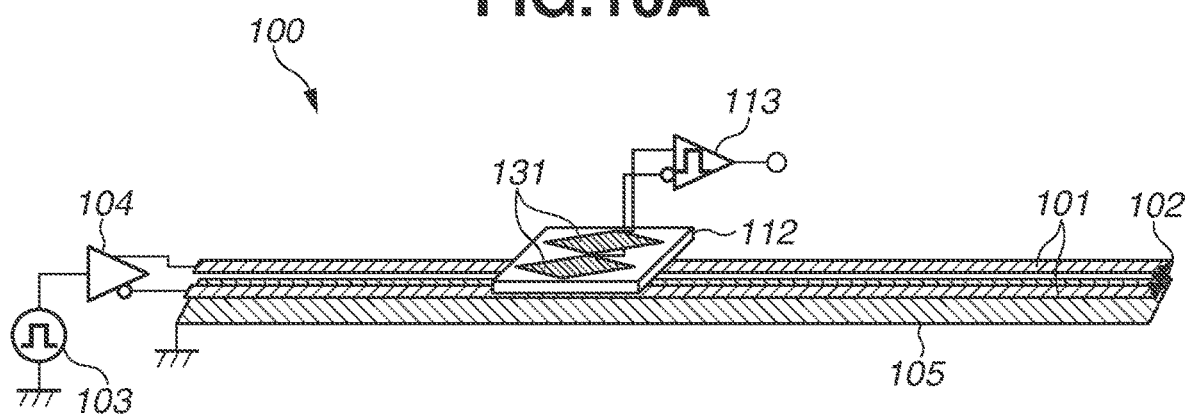
FIGS. 10A and 10B are diagrams illustrating a configuration example of a communication system according to a second exemplary embodiment.

FIG. 10A is a diagram illustrating a configuration example of a communication system 100 according to a second exemplary embodiment. The communication system 100 illustrated in FIG. 10A is configured such that the communication system 100 illustrated in FIG. 3A is provided with a pair of reception couplers 131 instead of the pair of reception couplers 111. The reception couplers 131 are different in shape from the reception couplers 111. The communication system 100 has a pair of differential transmission lines 101, a termination resistor 102, a signal source 103, a differential transmission buffer 104, a ground surface 105, the pair of reception couplers 131, a substrate 112, and a reception circuit 113. Hereinafter, differences between the second exemplary embodiment and the first exemplary embodiment will be described.

Figure 10B:
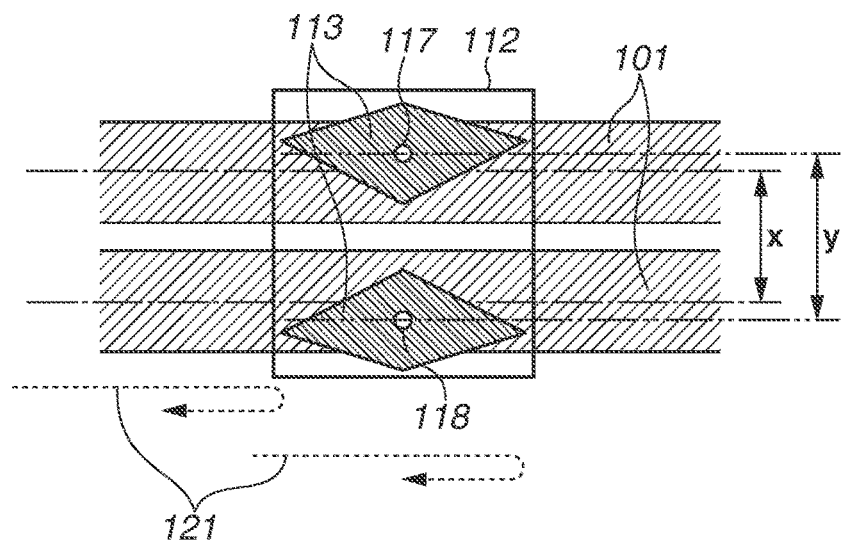

FIG. 10B is an enlarged view of the reception couplers 131 illustrated in FIG. 10A. The reception couplers 131 have a quadrangular shape obtained by deforming a rhombus. As in the case of FIG. 3B, the end portions of the pair of reception couplers 131 are located outwards from the corresponding centers of the pair of differential transmission lines 101. As described above, the rhombic reception couplers 111 illustrated in FIG. 3B have small end surfaces, so that the frequency characteristics are extended on the high band side and the gain flatness is improved as compared to the rectangular reception couplers 116 illustrated in FIG. 1B. The respective end portions of the pair of reception couplers 116 illustrated in FIG. 3B are located on the corresponding center lines of the pair of reception couplers 111 with respect to the width direction of the pair of reception couplers 111. The end portions of the pair of reception couplers 131 illustrated in FIG. 10B are located outwards from the corresponding centers of the pair of reception couplers 111 with respect to the width direction of the pair of reception couplers 111.

Figure 11:
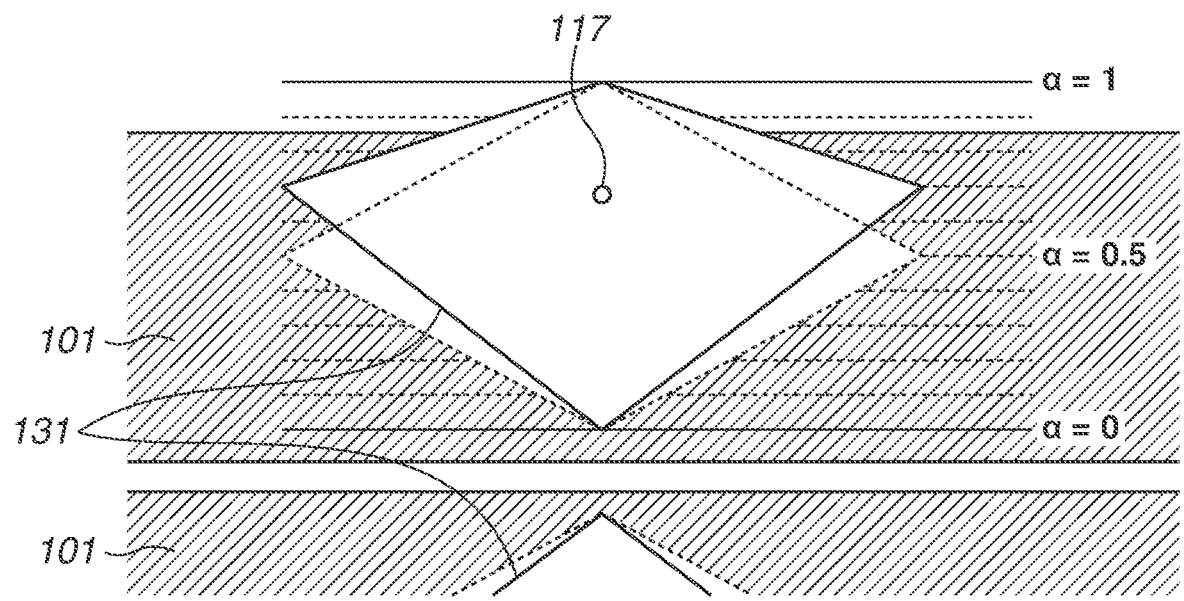
FIG. 11 is an enlarged view of a reception coupler according to the second exemplary embodiment.

FIG. 11 is an enlarged view of one of the reception couplers 131 illustrated in FIG. 10B. Ratio α is ratio between different positions of the end portions of the reception coupler 131. The ratio α is 0 if the end portions of the reception coupler 131 are located at the innermost positions within the width of the reception coupler 131, and the ratio α is 1 when the end portions of the reception coupler 131 are located at the outermost positions within the width of the reception coupler 131.

When the ratio α is 0.5, the end portions of the reception coupler 131 are located at the center of the reception coupler 131, and the reception coupler 131 is formed in a rhombic shape. When the ratio α is smaller than 0.5, the end portions of the reception coupler 131 are located on the inner side in the width direction of the reception coupler 131. When the ratio α is greater than 0.5, the end portions of the reception coupler 131 are located on the outer side in the width direction of the reception coupler 131.

The center point of each of the reception couplers 131 is located outwards from the center point of the corresponding differential transmission line 101. Thus, the electric field distribution of the differential transmission line 101 is strong on the inner side of the reception coupler 131 and is weak on the outer side of the reception coupler 131. When the ratio α is smaller than 0.5, electric charge is greatly excited at the long part of the reception coupler 131 so that the resonance point shifts to the low frequency side and the gain at the resonance point increases as compared to the case with the rhombic reception coupler at the ratio α of 0.5. Thus, in the output characteristics with the ratio α smaller than 0.5, the gain flatness becomes deteriorated as compared to in the output characteristics with the ratio α of 0.5.

In contrast, when the ratio α is greater than 0.5, electric charge is induced in a strong electric field at the inner short part of the reception coupler 131. On the other hand, the outer long part of the reception coupler 131 has a larger area so that the resonance point shifts toward the low frequency side as compared to the case with the rhombic shape at the ratio α of 0.5, but the gain peak is suppressed. When the gain peak at the resonance point is suppressed, the gain flatness is improved thereby reducing the distortion in the reception signal. Judging from these matters, the highest frequency bandwidth is achieved when the ratio α is around 0.5. If the ratio α is larger than 0.5, the gain flatness is improved and the distortion in the signal is reduced.

Figure 12:
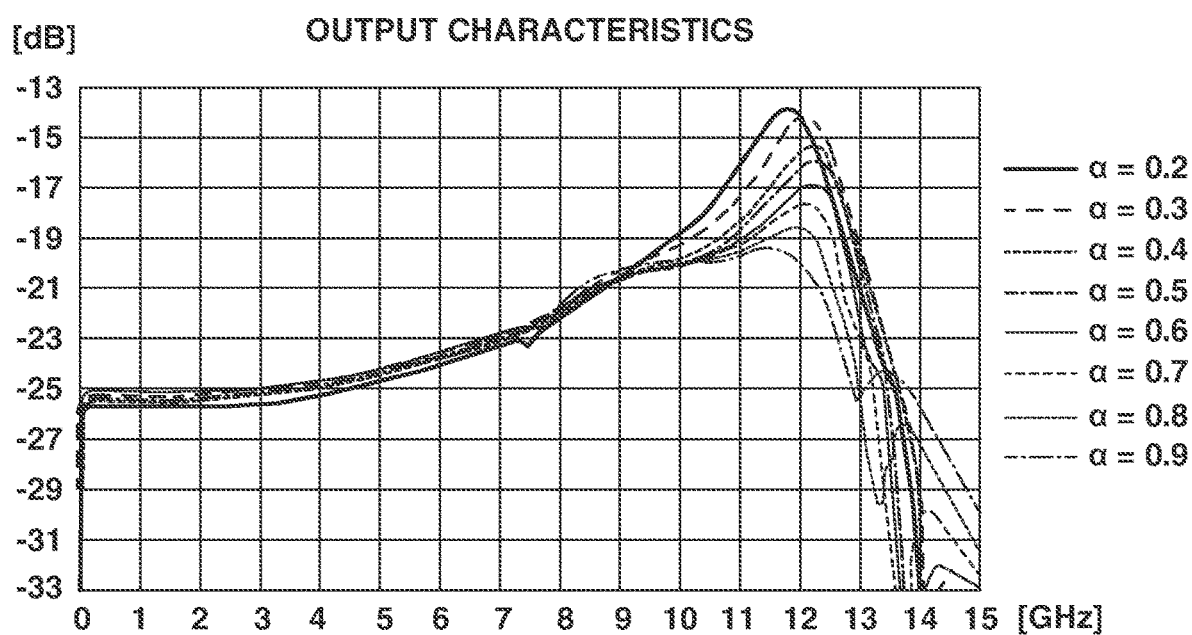
FIG. 12 is a diagram illustrating output frequency characteristics according to the second exemplary embodiment.

FIG. 12 is a diagram illustrating frequency characteristics of output signals of the reception couplers 131 with varying ratio α. When the ratio α is greater than 0.5, it is possible to ensure the gain flatness and reduce the distortion in reception signals. That is, in the design process of the reception couplers 131, shifting the end portions of the reception couplers 131 outward in the width direction to an extent that the required bandwidth can be obtained makes it possible to ensure the gain flatness and reduce the distortion in reception signals.

Figure 13:
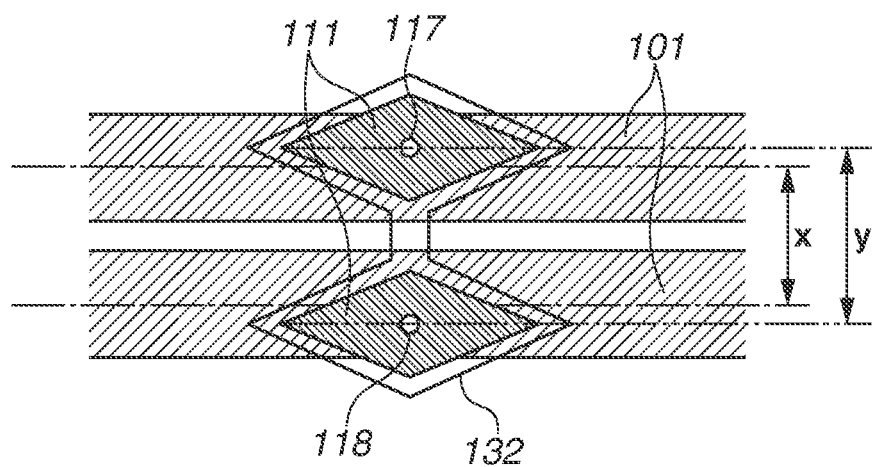
FIG. 13 is an enlarged view of a reception coupler according to a third exemplary embodiment.

FIG. 13 is a diagram illustrating a configuration example of a part of a communication system 100 according to a third exemplary embodiment. FIG. 13 illustrates a substrate 132 that is provided in the configuration illustrated in FIG. 3B instead of the substrate 112. A pair of reception couplers 111 is formed on the substrate 132. The substrate 132 supports the pair of reception couplers 111. The substrate 132 has approximately the same rhombic shape as the reception couplers 111 and is sized enough to form the pattern of the reception couplers 111. The substrate 132 is similar in shape to the pair of reception couplers 111. This reduces unnecessary loss of the reception couplers 111 caused by the material of the substrate 132 and further improves the resonance point.

FIG. 14A is a diagram illustrating output characteristics of the reception couplers 111 according to the third exemplary embodiment. FIG. 14B is a diagram illustrating reflection characteristics of differential transmission lines 101 according to the third exemplary embodiment. FIGS. 14A and 14B illustrate the characteristics where the center distance y between the reception couplers 111 is 5 mm and the width w of the reception couplers 111 is varied.

In the reflection characteristics of FIG. 14B, the reflection with a 7-GHz bandwidth in the first and second exemplary embodiments is not seen, and the reflection gradually increases up to the vicinity of the resonance point and is kept at about −20 dB up to 10 GHz or so where the width w of the reception couplers 111 is 4 mm or less. In the first and second exemplary embodiments, when the widths w of the reception couplers 111 and 131 are small, the reflection becomes large and the peak around the resonance point is likely to increase. In the third exemplary embodiment, the substrate 132 is smaller in size in accordance with the sizes of the reception couplers 111, so that loss is reduced and output gain is likely to be obtained. However, when the width w of the reception couplers 111 is smaller than half the width of the differential transmission lines 101, the shape of the reception couplers 111 hardly makes a difference, as described with reference to FIGS. 8A and 8B. The widest parts of the pair of reception couplers 111 are each preferably equal to or more than half the width of the pair of the differential transmission lines 101.

Figure 15A:
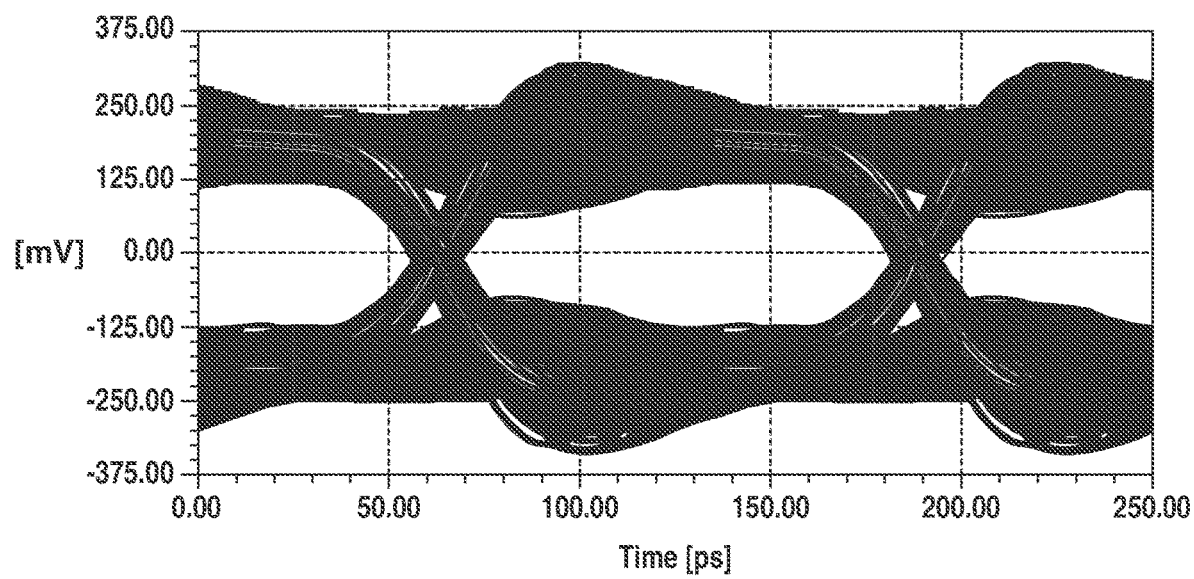
FIGS. 15A and 15B are diagram illustrating eye patterns of output signals according to the third exemplary embodiment.
Figure 15B:
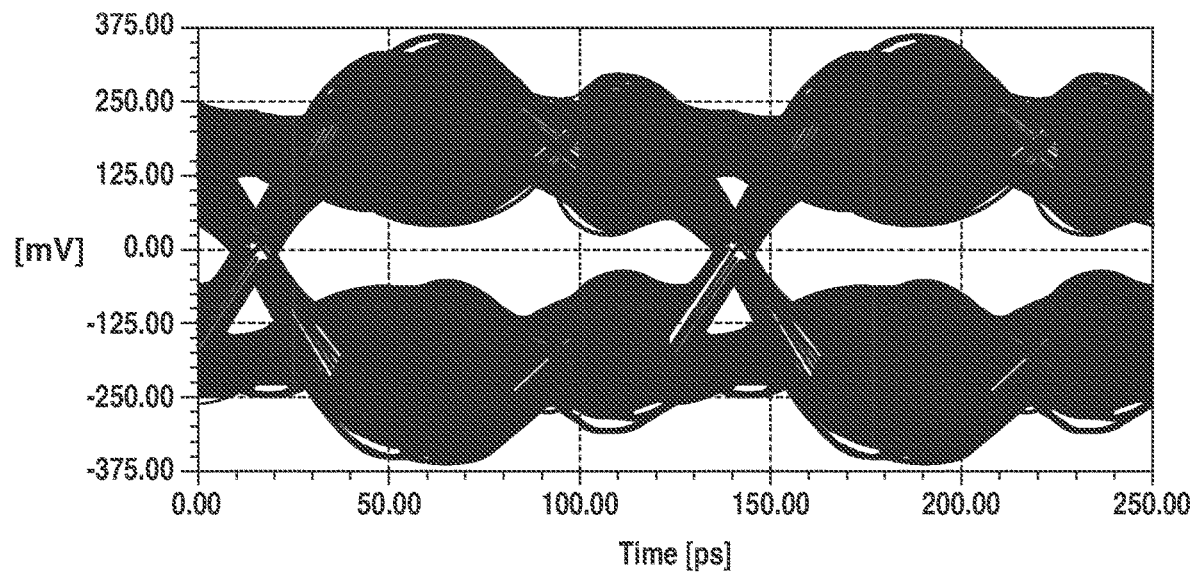

FIG. 15A is a diagram illustrating an eye pattern of waveforms of output signals from the reception couplers 111 in 8-Gbps data transmission according to the third exemplary embodiment. FIG. 15B is a diagram illustrating an eye pattern of waveforms of output signals from the rectangular reception couplers 116 illustrated in FIG. 1B, in the same manner as described in FIG. 7B. The third exemplary embodiment illustrated in FIG. 15A further improves signal quality due to the rhombic shape of the substrate 132, as compared to the second exemplary embodiment illustrated in FIG. 7A.

In the third exemplary embodiment, the substrate 132 supporting the reception couplers 111 is shaped in as a small size as possible. However, if the pair of reception couplers 111 is made of hard metal sheets and the output lines of the reception couplers 111 can be attached and fixed to the substrate of the reception circuit 113, the substrate 132 may be omitted. The pair of reception couplers 111 may be metal sheets that maintain their shapes without a substrate supporting the pair of reception couplers 111.

Figure 16A:
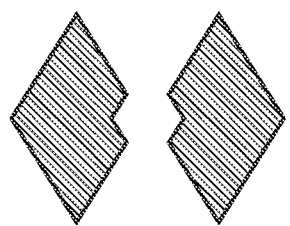
FIGS. 16A to 16C are diagrams illustrating other forms of a reception coupler.
Figure 16B:
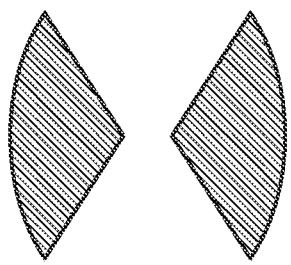
Figure 16C:
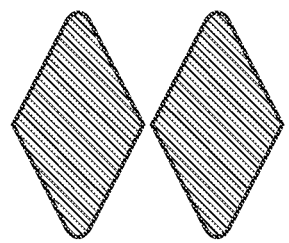

In the first to third exemplary embodiments, the reception couplers 111 and 131 with narrow end portions have a rhombic shape or a shape of a rhombus with end portions shifted outward. However, the shapes of reception couplers are not limited to these shapes. As illustrated in FIGS. 16A to 16C, a pair of reception couplers may have another shape as far as the reception couplers have end portions narrower than other parts with respect to the transmission direction of the pair of differential transmission lines 101. In the first to third exemplary embodiments, the reception couplers 111 and 131 have angular shapes. Alternatively, the reception couplers 111 and 131 may have shapes with corners circularly or linearly chamfered. The pair of reception couplers 111 and 131 can have a rhombic shape or a shape of a rhombus with corners circularly or linearly chamfered.

In the first to third exemplary embodiments, the shapes of the pair of reception couplers 111 and 131 are each symmetric with respect to the transmission direction of the pair of differential transmission lines 101. However, the reception couplers may not necessarily be symmetric. As described above, the coupling between the reception couplers is preferably small, and thus the shapes of the pair of reception couplers at the respective end portions facing each other is desirably not parallel or approximately parallel.

In the first to third exemplary embodiments, the pair of differential transmission lines 101 is differential microstrip lines formed on a polytetrafluoroethylene (PTFE) substrate. However, the thickness of the PTFE substrate, the line width of the differential microstrip lines, the center distance between the differential microstrip lines, the distance between the differential transmission lines 101 and the ground surface 105, and the material for the substrate are not limited.

The pair of differential transmission lines 101 may be transmission lines patterned on a flexible substrate. In this case, the grounds of the transmission lines on the flexible substrate may be arranged at positions separated from the flexible substrate. The pair of differential transmission lines 101 may be another type of differential transmission lines, such as differential strip lines, differential coplanar lines, and grounded differential coplanar lines.

Figure 17A:
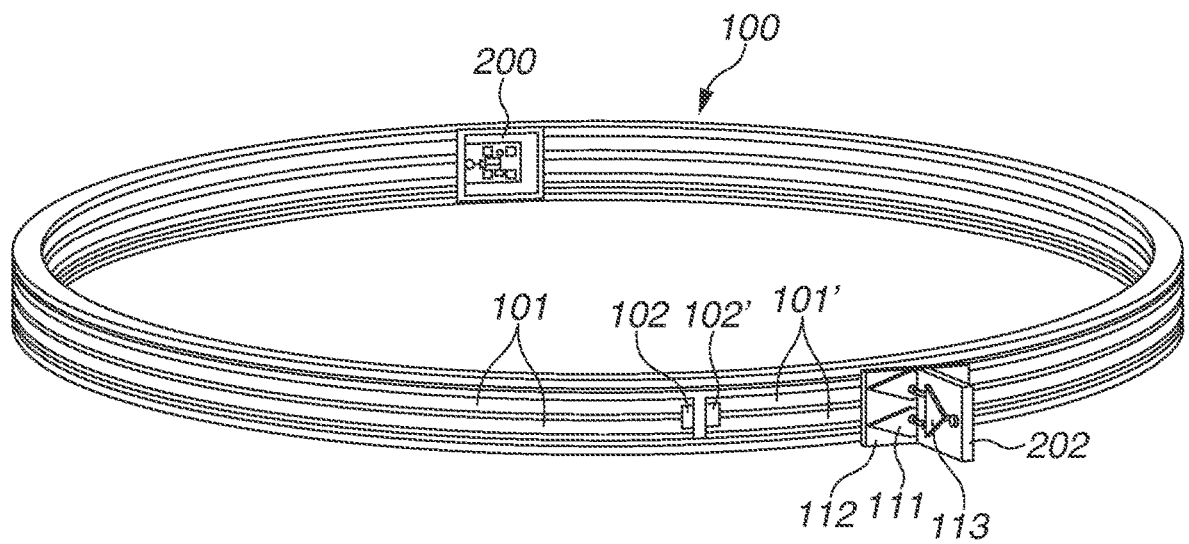
FIGS. 17A, 17B, and 17C are diagrams illustrating the communication system applied to a computed tomography (CT) diagnostic imaging apparatus according to a fourth exemplary embodiment.

A fourth exemplary embodiment will be described below. FIG. 17A is a diagram illustrating an example of application of a communication system 100 in any of the first to third exemplary embodiments to a computed tomography (CT) image diagnostic apparatus or the like. The communication system 100 has a pair of differential transmission lines 101, another pair of differential transmission lines 101', termination resistors 102 and 102', a pair of reception couplers 111, a substrate 112, a reception circuit 113, and electric substrates 200 and 202. The electric substrate 200 is connected to signal input portions of the differential transmission lines 101 and signal input portions of the differential transmission lines 101' to output differential signals to the respective signal input portions of the differential transmission lines 101 and 101'. The differential transmission lines 101 and 101' transmit the input signals counterclockwise. The signals from the differential transmission lines 101 and 101' are absorbed by the termination resistors 102 and 102' that are almost equal to differential impedance.

Figure 17B:
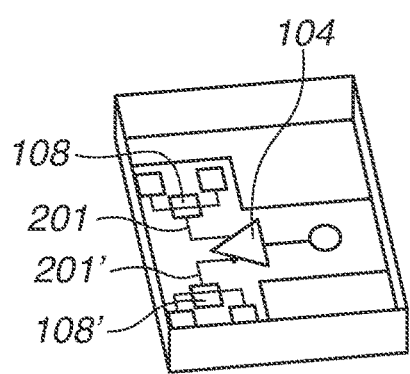

FIG. 17B is a diagram illustrating a configuration example of the electric substrate 200 illustrated in FIG. 17A. The electric substrate 200 has a differential transmission buffer 104, wave separators 108 and 108', and differential transmission lines 201 and 201'. The differential transmission buffer 104 outputs differential signals to the wave separators 108 and 108' through the differential transmission lines 201 and 201'. The wave separators 108 and 108' separate the input differential signal into two differential signals and outputs the two differential signals to the respective differential transmission lines 101 and 101' illustrated in FIG. 17A.

Output nodes of the wave separators 108 and 108' are directly connected to vias of the differential transmission lines 101 and 101'. Alternatively, amplifiers, attenuators, or filters may be inserted into the output nodes of the wave separators 108 and 108'. Instead of the wave separators 108 and 108', switches may be used to change the output destinations.

Figure 17C:
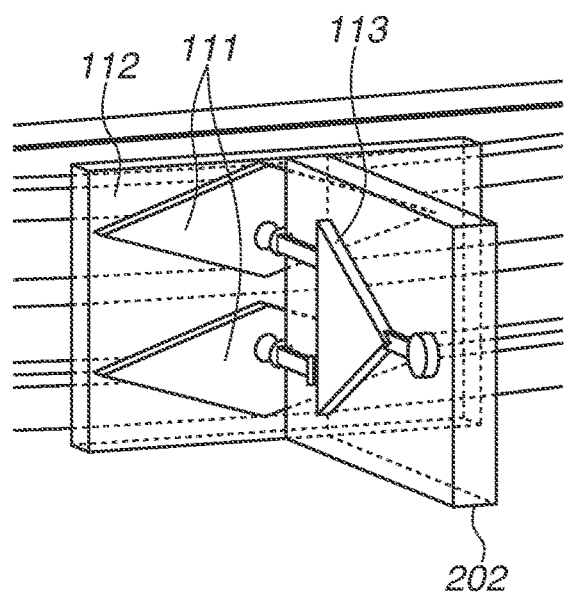

FIG. 17(C) is an enlarged view of the pair of reception couplers 111, the substrate 112 and the electric substrate 202 illustrated in FIG. 17A. The pair of reception couplers 111 is patterned on the substrate 112 and receives differential signals from the pair of differential transmission lines 101 or 101'. The pair of reception couplers 111 is capacitive couplers that are symmetric with respect to the differential signals transmitted on the differential transmission lines 101 and 101'. Thus, the signals will not change depending on from which of the differential transmission lines 101 and 101' the signals have been received. The reception couplers 111 are formed on the substrate 112 and connected to the reception circuit 113 on the electric substrate 202 through the vias. The reception circuit 113 shapes the waveforms of output differential signals from the pair of reception couplers 111 by amplification and filtering, and outputs a reception signal.

As described above, according to the first to fourth exemplary embodiments, it is possible to suppress deterioration in the quality of reception signals in the communication system 100 including the differential transmission lines 101 and the reception couplers 111 or 131 moving over the differential transmission lines 101. The communication system 100 can suppress the reflection caused by the reception couplers 111 and 131 while maintaining the signal bandwidth and gain.

The above-described exemplary embodiments are all mere examples for carrying out the present invention, and the technical scope of the present invention should not be interpreted in a limited way due to these exemplary embodiments. That is, the present invention can be carried out in various modes without departing from the technical idea or main features of the present invention.

According to the above-described exemplary embodiments, it is possible to suppress the disturbance of signals in wireless communication that can be caused by electromagnetic coupling between a coupler moving along a transmission line and the transmission line.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While various embodiments of the present disclosure have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-108794, filed Jun. 24, 2020, which is hereby incorporated by reference herein in its entirety.

What is claimed is:

1. A communication system comprising:
a transmission line; and
a reception coupler that couples to the transmission line in an electromagnetic field and moves along the transmission line,
wherein the reception coupler has end parts narrower than other parts with respect to a transmission direction of the transmission line.

2. The communication system according to claim 1, wherein a widest part of the reception coupler has a width half or more than a width of the transmission line.

3. The communication system according to claim 1,
wherein the transmission line is a pair of transmission lines that transmits differential signals, and
wherein the reception coupler is a pair of reception couplers that moves along the pair of transmission lines, and
the pair of reception couplers each have end parts narrower than other parts with respect to a transmission direction of the pair of transmission lines.

4. The communication system according to claim 3, wherein a center distance between the pair of reception couplers is longer than a center distance between the pair of transmission lines.

5. The communication system according to claim 3, wherein the pair of reception couplers each has a rhombic shape or a shape of a rhombus with corners linearly or circularly chamfered.

6. The communication system according to claim 3, wherein the respective end parts of the pair of reception couplers are located outwards from respective centers of the pair of the reception couplers with respect to a width direction of the pair of reception couplers.

7. The communication system according to claim 3, wherein the pair of reception couplers each has a shape that is not parallel or approximately parallel at respective parts thereof facing each other.

8. The communication system according to claim 3, wherein the pair of reception couplers is symmetric with respect to the transmission direction of the pair of transmission lines.

9. The communication system according to claim 3, further comprising a substrate that supports the pair of reception couplers,
wherein the substrate is similar in shape to the pair of reception couplers.

10. The communication system according to claim 3, wherein the pair of reception couplers is made of metal sheets that maintain shapes thereof without a substrate supporting the pair of reception couplers.

11. The communication system according to claim 3, wherein the pair of transmission lines is differential microstrip lines, differential strip lines, differential coplanar lines, or grounded differential coplanar lines.

* * * * *